(12) United States Patent
Akashi et al.

(10) Patent No.: US 6,693,932 B2
(45) Date of Patent: Feb. 17, 2004

(54) OPTICAL WAVELENGTH STABILIZATION CIRCUIT, OPTICAL TRANSMITTER AND OPTICAL TRANSMISSION SYSTEM

(75) Inventors: Mitsuo Akashi, Yokohama (JP); Yoichi Honzawa, Yokohama (JP); Sunil Sharma, Yokohama (JP); Shigeru Tokita, Yokohama (JP)

(73) Assignee: Opnext Japan, Inc. (JP)

( * ) Notice: Subject to any disclaimer, the term of this patent is extended or adjusted under 35 U.S.C. 154(b) by 0 days.

(21) Appl. No.: 09/887,737

(22) Filed: Jun. 22, 2001

(65) Prior Publication Data

US 2002/0136249 A1 Sep. 26, 2002

(30) Foreign Application Priority Data

Mar. 14, 2001 (JP) ........................................ 2001-072834

(51) Int. Cl.[7] ................................................. H01S 3/13
(52) U.S. Cl. ............................ 372/32; 372/20; 372/26; 372/29.02; 372/29.011; 372/38.01; 372/34
(58) Field of Search ............................. 372/32, 20, 26, 372/34, 35, 38.01, 29.02, 29.011, 23

(56) References Cited

U.S. PATENT DOCUMENTS

| | | | | |
|---|---|---|---|---|
| 6,134,253 A | * | 10/2000 | Munks et al. | ................... 372/23 |
| 6,289,028 B1 | * | 9/2001 | Munks et al. | ................... 372/20 |
| 2002/0071458 A1 | * | 6/2002 | Iwafuji | ........................ 372/23 |

FOREIGN PATENT DOCUMENTS

EP         0939470         9/1999

OTHER PUBLICATIONS

European Search Report dated May 22, 2002.
Modified abstract of the European Application No. 01115325.1–2214.

* cited by examiner

Primary Examiner—Paul Ip
Assistant Examiner—Delma R. Flores-Ruiz
(74) Attorney, Agent, or Firm—Sofer & Haroun, LLP (57) ABSTRACT

In the initial state, any wavelength variation of the output signal light with a change of the current injected into the laser is monitored with a wavelength meter, the quantity of wavelength variation is fed back to the wavelength compensation circuit, a compensation voltage for maintaining the wavelength in the initial stage is figured out, and that voltage is recorded into a memory element or the like. A configuration to add this compensation voltage to a comparator makes it possible to compensate for fluctuations of the characteristics of the optical splitter, wavelength filter and light receiving elements and thereby to obtain a stable optical wavelength. By constantly monitoring the injected current applied to the laser when the optical transmitter is in operation and giving a compensation voltage matching the current variation to the comparator, stabilization of the optical wavelength can be realized. By simulating in the initial state the operation of the laser after deterioration and providing in advance a compensation voltage for suppressing wavelength fluctuations, wavelength fluctuations after deterioration can be restrained.

6 Claims, 5 Drawing Sheets

FIG. 1

(PRIOR ART)

(PRIOR ART)

OPTICAL WAVELENGTH STABILIZATION CIRCUIT, OPTICAL TRANSMITTER AND OPTICAL TRANSMISSION SYSTEM

BACKGROUND OF THE INVENTION

1. Field of the Invention

The present invention relates to an optical wavelength control method which makes possible architecture of a high density wavelength division multiplexing (WDM) system by controlling with high accuracy the optical wavelength of optical signals supplied by an optical transmitter used in the WDM system and thereby stabilizing the optical wavelength. The invention further enables optical communication systems to be reduced in size. The invention is particularly suitable for a wavelength control method by which, where a wavelength monitoring section for constantly monitoring the wavelength is integrated into a light source section, wavelength fluctuations due to degradation or any other factor are restrained.

2. Description of the Related Art

Figure 1:
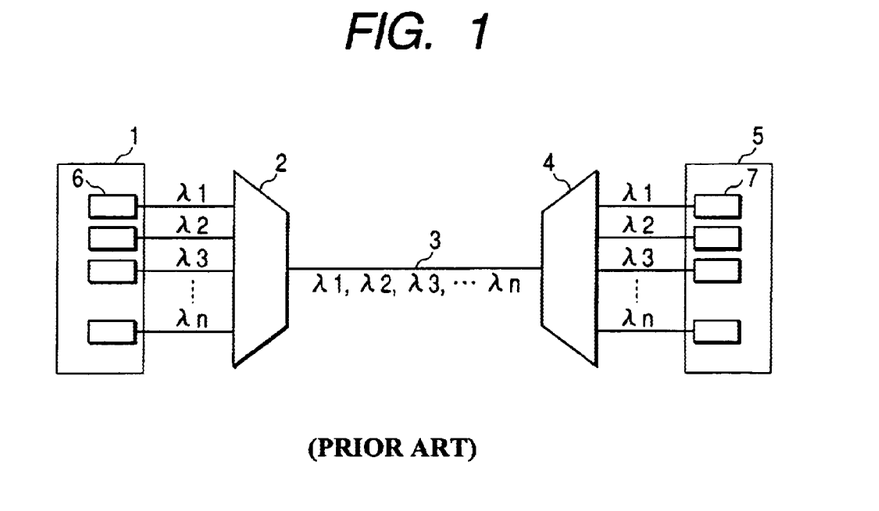
FIG. 1 illustrates the configuration of an optical wavelength multiplexing system.

In optical fiber communication, wavelength multiplexing is used for economical transmission of a greater quantity of information. FIG. 1 illustrates a model of this method. An optical transmission system 1 on the sending side uses an optical transmitter 6 having different optical wavelengths $\lambda 1$ through $\lambda N$ and an optical multiplexer 2 to wavelength-multiplex individual optical signals onto a single fiber 3. An optical transmission system 5 on the receiving side uses an optical demultiplexer 4 to demultiplex the optical signals. In this manner, the capacity of an existing transmission line can be economically increased using existing optical fibers. In the drawing, reference numeral 7 denotes an optical receiver.

A further increase in transmission capacity can be achieved by broadening the band of wavelengths used. However, in order for optical fibers to transmit optical signals efficiently with little loss, the range of usable wavelengths is limited. Therefore, for multiplexing more optical signals, the wavelength spacing should be narrowed to achieve a higher density.

In today's high density wavelength multiplexing systems, the oscillation wavelength of the semiconductor laser ranges between 1530 nm and 1560 nm. If adjoining wavelengths are spaced at 0.8 nm, about 40 waves can be wavelength-multiplexed. To achieve an even higher density, the wavelength spacing may be narrowed to 0.4 nm or even 0.2 nm to make possible wavelength multiplexing of 80 or 160 waves, respectively.

An important factor in increasing the density of wavelength multiplexing is the stability of wavelengths. If they are unstable, optical signals which are supposed to be independent from other optical signals of different wavelengths leak into signals of adjoining wavelengths, making it impossible to achieve a desired qualitative level of communication. Usually, the tolerable fluctuation in a wavelength multiplexing system of 0.8 nm in wavelength spacing is not more than 0.1 nm, and in a system of 0.4 nm or 0.2 nm the tolerance is about 0.05 nm or 0.025 nm, respectively.

The wavelength of a semiconductor laser used in a wavelength multiplexing system is heavily dependent on the temperature of the active layer of the semiconductor laser. Therefore, in order to enhance the stability of wavelengths, more accurate temperature control of the active layer of the semiconductor laser device is required.

Also, an optical transmitter used in optical communication is required not to fluctuate substantially in its average output intensity, and to realize this function there is used an auto-power control (APC) circuit. Even where the efficiency of light emission that can be expressed in the ratio between the output intensity of and the injected current to the semiconductor laser varies on account of the degradation of the laser or any other factor, this APC circuit controls the current injected to the laser so as to keep the average output intensity constant, resulting in a stable output intensity.

However, a variation in the current injected into the semiconductor laser device invites a variation in power consumption in the active layer of the semiconductor laser, resulting in a temperature change in the active layer. This temperature change in the active layer invites a variation in optical wavelength, posing a serious impediment to architecture of a high density wavelength multiplexing system.

Therefore, in order to realize a high density wavelength multiplexing system, a major requirement is to establish a temperature control method for keeping the temperature of this active layer constant.

Figure 2:
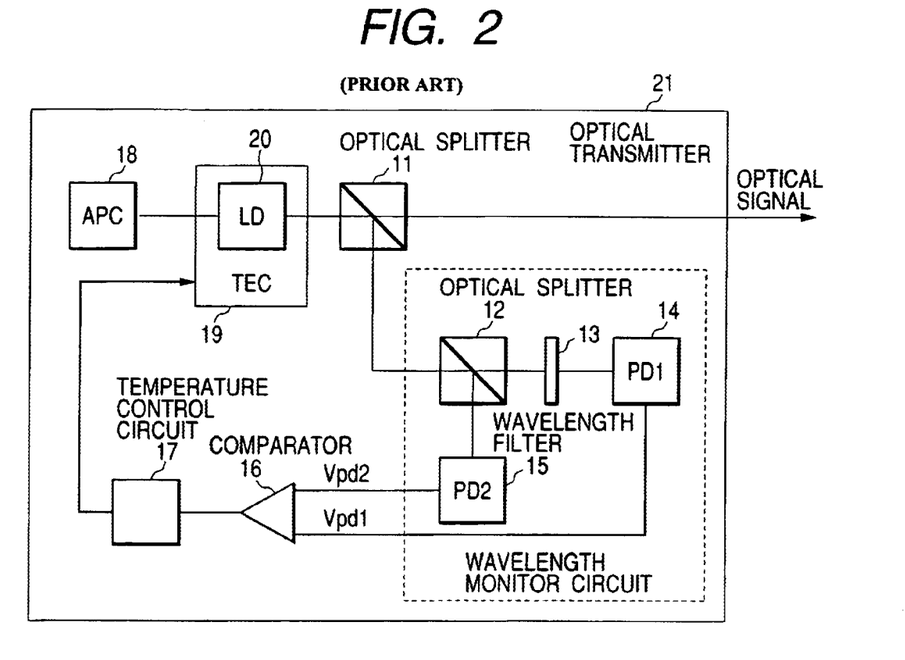
FIG. 2 illustrates an example of wavelength control method according to the prior art.
Figure 3:
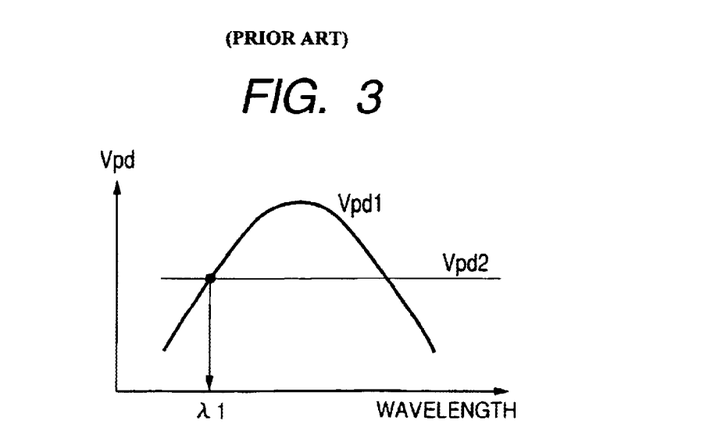
FIG. 3 illustrates the wavelength-dependence of the wavelength monitoring output in the wavelength control method according to the prior art.

FIG. 2 is a conceptual diagram illustrating an example of wavelength control method according to the prior art. The output optical signals of a light source 20 of an optical transmitter are branched into two segments using an optical splitter 11. Optical signals of one of these branched lights are further separated into two directions by another optical splitter 12. This semiconductor laser device is controlled in light intensity by an APC circuit. Optical signals in one of the directions into which separation was done by the optical splitter 12, after passing a wavelength filter 13 whose optical transmissivity is dependent on the optical wavelength, are received by a light receiving element (PD1) 14. Optical signals in the other direction are received directly by a light receiving element (PD2) 15 without going through the wavelength filter. A voltage Vpd1 generated by a photo current generated by the PD1 is similarly wavelength-dependent as shown in FIG. 3. Another voltage Vpd2 generated by the photo current generated by the PD2 is not wavelength-dependent because it does not go through the wavelength filter. FIG. 3 illustrates an example of the wavelength-dependence of the wavelength monitoring output, wherein the horizontal axis represents the wavelength, and the longitudinal axis represents the output Vpd.

By setting as desired the voltage Vpd2 to be generated by the PD2 and keeping the difference between Vpd1 and Vpd2 constant, the output optical wavelength of the laser can be set to a desired optical wavelength $\lambda 1$. Vpd1 and Vpd2 are received by a comparator 16, and the resultant error signal is fed back to a temperature control circuit 17 for controlling the laser temperature. The laser is mounted on a thermoelectric cooler (TEC) 19, and the temperature of the TEC 19 is controlled with a signal from the temperature control circuit 17. The temperature of the active layer of the semiconductor laser device is thereby kept constant. An example of optical wavelength stabilization system for keeping the optical wavelength of a laser constant by using a wavelength monitor circuit in this manner is disclosed in, for instance, a laid-open patent JP-A No. H11-251673.

Figure 4:
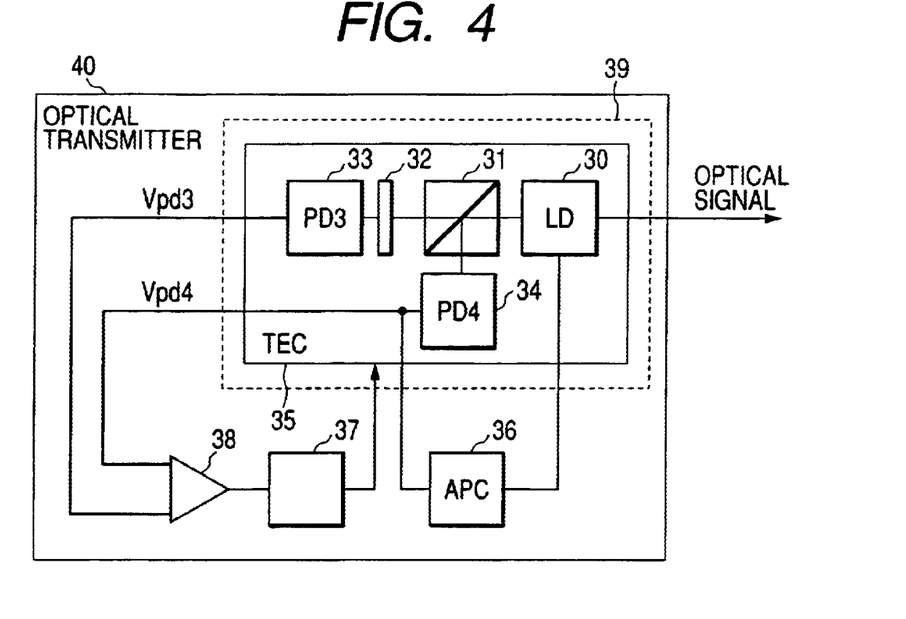
FIG. 4 illustrates an example of wavelength control method using a laser module with wavelength monitor according to the prior art.

According to the prior art, the section for controlling the temperature of the laser and that for monitoring its wavelength used to be configured as separate components. However, in response to a demand for smaller optical communication systems, integration of these laser mounting section and the wavelength monitoring section has been attempted. FIG. 4 illustrates how these components are packaged when they are integrated.

In an optical transmitter 40 illustrated in FIG. 4, a laser element 30, an optical splitter 31, a wavelength filter 32, a light receiving element 33 (PD3) and another light receiving element 34 (PD4) are mounted on a TEC 35 for controlling the temperature of the semiconductor laser element 30. The laser module with a wavelength monitor 39 is formed by comprising the laser element 30, the optical splitter 31, the wavelength filter 32, the light receiving element 33, 34 and the TEC. The light intensity of the semiconductor laser is controlled by an APC circuit 36. Control of the optical wavelength, as in the case of FIG. 2, is accomplished by comparing with a comparator 38 Vpd3 and Vpd4 generated by photo current flowing in the PD3 and the PD4, and feeding back the resultant error voltage to a temperature control circuit 37 of the laser. This serves to stabilize the wavelength. As the light source section and the wavelength monitoring section are integrated in this way, the optical transmitter can be reduced size, and so can be the wavelength multiplexing system using it.

Examples of component packaging where these light source section and wavelength monitoring section are integrated include what was described in a paper entitled "A Turnable LD Module with a Built-in Wavelength Monitoring Section" presented at the 2000 general convention of the Institute of Electronics, Information and Communication Engineers (in Japanese).

In the conventional laser module with wavelength monitor in which the light source section and the wavelength monitoring section are integrated, as illustrated in FIG. 4 cited above, the laser element 30 laser module with wavelength monitor, optical splitter 31, wavelength filter 32 and light receiving elements. 33 and 34 are mounted on the same TEC 35. If the efficiency of light emission that can be expressed in the ratio between the output intensity of and the injected current to the laser varies as a result of the degradation of the laser or any other factor, then the oscillation wavelength of the laser is controlled as described below.

The APC circuit 36 controls the injected current to the laser so as to keep the output intensity constant, and power consumption by the active layer of the laser varies, resulting in a change in the temperature of the active layer. As the temperature change of the active layer invites a change in the oscillation wavelength of the laser, the photo current generated by the PD3 through the wavelength filter varies. Since the efficiency of light emission by the laser usually drops as the laser performance deteriorates over time, the injected current to the laser increases, the temperature of the active layer rises, and the oscillation wavelength shifts toward the longer wavelength side.

The voltages Vpd3 and Vpd4 generated by the photo current of the PD3 and the PD4 are compared by the comparator 38, the resultant error signal is delivered to the temperature control circuit 37, and the laser element temperature is controlled so as to minimize the error. Accordingly, even after degradation, the oscillation frequency of the laser is controlled to stay at $\lambda 1$ all the time.

However, as a result of the integration of the wavelength monitoring section, the optical splitter, wavelength filter and light receiving elements are mounted on the TEC for controlling the laser temperature in addition to the laser, and the temperatures of these elements also vary when the temperature of the laser element is controlled with the TEC.

If the splitting rate of the optical splitter, the wavelength transmissivity of the wavelength filter and the light receiving efficiencies of the light receiving elements were not temperature-dependent, there would be no problem in wavelength control. However, all these characteristics are temperature-dependent. Particularly so is the wavelength transmissivity of the wavelength filter, and this factor accounts for a large part of the wavelength fluctuations of the laser module with a built-in wavelength monitor into which the wavelength monitoring section is integrated.

Figure 5:
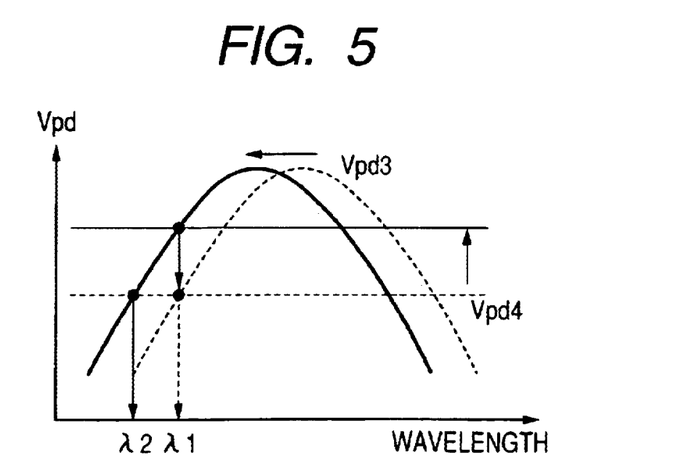
FIG. 5 illustrates the process of wavelength variation in the laser module with wavelength monitor and the process of wavelength stabilization according to the present invention.

The process of wavelength fluctuations in the laser module with a built-in wavelength monitor into which the wavelength monitoring section is integrated is traced in FIG. 5. FIG. 5 illustrates the wavelength-dependence of the output of the laser module with wavelength monitor and variations in its characteristics with changes in ambience. Usually a semiconductor laser consisting of a material containing indium, gallium, arsenic or the like is used for optical communication, and the current required to be injected to achieve a desired light intensity is about 80 mA. When the efficiency of light emission by the semiconductor laser has fallen by 10% due to degradation, the APC circuit controls the injected current so as to keep the output intensity of the laser constant, resulting in a rise of the injected current to 88.9 mA. Then, as power consumption by the laser increases, the temperature of the active layer of the laser rises, usually by about 2° C. under the above-described conditions. The control by the wavelength monitor circuit, comparator and temperature control circuit to keep the temperature of the active layer constant reduces the temperature on the TEC by 2° C. from its initial level. The wavelength transmissivity of the wavelength filter is particularly temperature-dependent among the characteristics of the components mounted on the TEC. Where the wavelength filter is made of etalon, the temperature-dependence of its transmissible wavelength is about −0.01 nm/° C. Therefore, if the temperature of the TEC falls by 2° C., the transmissible wavelength of the output voltage Vpd3 of the PD3 will shift by about −0.02 nm toward the shorter wavelength side. However, as the output voltage Vpd4 of the PD4 remains unchanged, the optical wavelength will stabilize at $\lambda 2$, 0.02 nm away from the initial level $\lambda 1$ toward the shorter wavelength side.

As described above, keeping the wave stable with high accuracy is a vital requirement for a high density optical multiplexing system. In such systems, in which the wavelength spacing is 0.4 nm and 0.2 nm, the tolerable wavelength fluctuations are no more than 0.05 nm and 0.025 nm, respectively.

However, where a laser module into which the wavelength monitoring section is integrated is to be used, though the system size can be reduced, the temperature-dependence of the wavelength filter substantially expands the quantity of wavelength fluctuations, making it impossible to achieve a desired stability of wavelength stability.

SUMMARY OF THE INVENTION

In the conventional laser module with wavelength monitor into which the wavelength monitoring section is integrated, the laser chip, wavelength filter and light receiving elements are mounted on the same TEC. When the laser temperature is controlled the temperature control circuit, the temperatures of the optical splitter, wavelength filter and light receiving elements also varied. The wavelength transmissivity of the wavelength filter is especially temperature-dependent, and this poses a particular impediment to wavelength stabilization with high accuracy.

In order to solve the problem noted above, the aforementioned wavelength destabilizing factor can be eliminated by mounting the laser element on one TEC and the optical splitter, wavelength filter and light receiving elements on another independent TEC and subjecting the laser element-mounted TEC alone to temperature control by the temperature control circuit. However, temperature control of independent TECs would invite increased circuit dimensions and power consumption, which would run counter to the object of reducing the optical communication system size. Therefore, this option is excluded here as a means to solve the problem.

In the laser module with wavelength monitor into which the wavelength monitoring section is integrated, with reference to FIG. 4, the laser temperature is controlled so as to keep the difference between the voltages generated by the PD3 and the PD4 constant. Therefore, when the temperature of the wavelength filter varies and thereby invites a variation in the transmissible wavelength characteristic, the voltage Vpd3 generated by the PD3 varies as illustrated in FIG. 5, but the voltage Vpd4 generated by the PD4 does not vary, resulting in a change of the oscillation wavelength from $\lambda 1$ to $\lambda 2$.

In order to keep the optical wavelength unchanged, the voltage Vpd4 generated by the PD4, when the voltage Vpd3 generated by the PD3 has changed, may be controlled according to the quantity of the change in Vpd 3.

In the initial operation of the laser module with wavelength monitor, the state of its operation after degradation can be simulated by varying the current injected into the laser. The control voltage to restrain the wavelength variation then is stored in advance as compensation voltage into a memory, such as a semiconductor storage for instance, and the required compensation voltage is added to Vpd4 on the basis of this datum. If the injected current varies after degradation, a compensation voltage matching the variation is added to Vpd4, and the sum is compared with Vpd3 to provide a control signal to the temperature control circuit on that basis. In this way, even where the laser element, optical splitter, wavelength filter and light receiving elements are mounted on the same TEC, changes in characteristics due to temperature variations can be compensated for to give a stable optical wavelength $\lambda 1$. FIG. 5 illustrates this state.

DETAILED DESCRIPTION OF THE PREFERRED EMBODIMENTS

Embodiment 1

Figure 6:
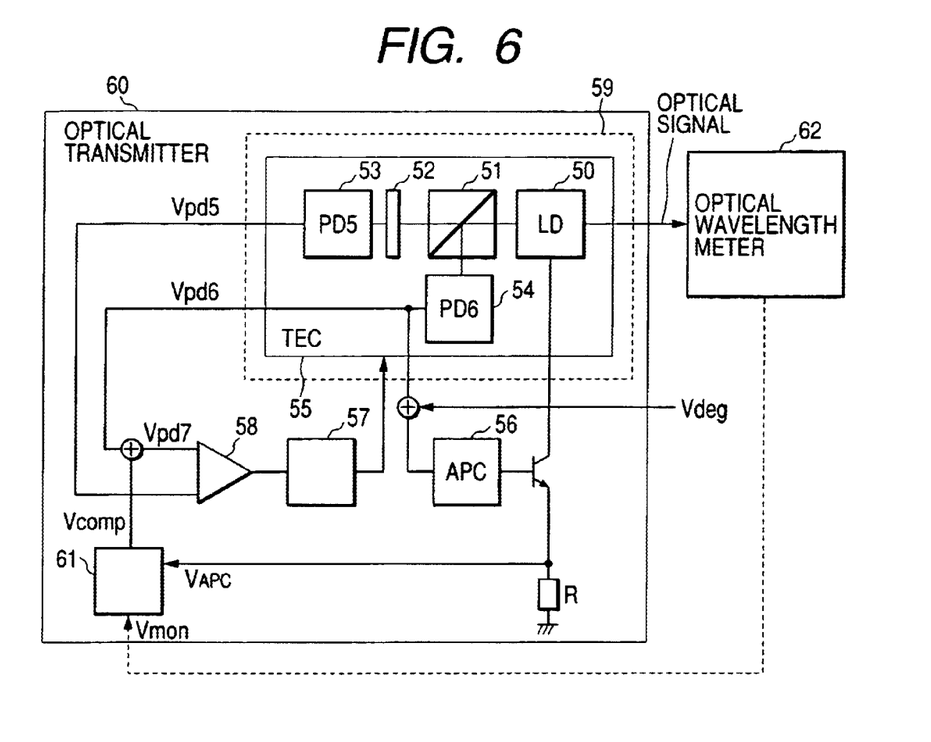
FIG. 6 illustrates an example of wavelength control method according to the invention.

Preferred embodiments of the present invention relating to a wavelength stabilizing method will be described in detail below with reference to drawings. FIG. 6 illustrates the configuration of an embodiment of the invention, including an optical transmitter 60 and an optical wavelength meter 62.

A laser element 50, an optical splitter 51, a wavelength filter 52 and light receiving elements 53 and 54 are mounted on the same TEC 55. The laser module with a wavelength monitor 59 is formed by comprising the laser element 50, the optical splitter 51, the wave filter 52, the light receiving element 53, 54 and the TEC. Wavelength stabilization in the initial state can be realized, as described above, by having one of two parts of optical signals into which optical signals split by the optical splitter 51 received by the light receiving element 53 (PD5) via the wavelength filter 52 while the other part of optical signals received by the light receiving element 54 (PD6) without going through the wavelength filter, having voltages Vpd5 and Vpd6 generated by photo currents flowing in the PD5 and the PD6, respectively, compared by a comparator 5, and feeding back the resultant error signal to a temperature control circuit 57 for the laser.

When the efficiency of light emission by the laser has fallen as a consequence of degradation, an APC circuit 56 increases the current injected into the laser element 50, resulting in a rise in the temperature of the active layer of the semiconductor laser device. This operation, after degradation, can be simulated by increasing the current injected into the laser in the initial state. As stated above, this deteriorated state and the compensation level for the injected current to compensate for the deteriorated state are determined in advance.

In order not to invite any variation in oscillation wavelength when the current injected into the laser is increased, a compensation voltage matching the variation in Vpd5, resulting from the change in the transmissivity of the wavelength filter due to the temperature control of the laser, is given to Vpd6, generated by the PD6 but not going through the wavelength filter. Vpd7, to which this compensation voltage has been added is given to the comparator as a reference voltage to effect control so as to keep the voltage difference between Vpd5 and Vpd7 constant all the time. In this way, there can be realized a state in which no variation in oscillation wavelength occurs when the current injected into the laser is increased.

This compensation voltage can be figured out in the initial state of operation in the following manner, and by having the compensation voltage stored by, for instance, a programmable read only memory (PROM), wavelength fluctuations can be restrained even after the degradation of the laser.

Figure 7:
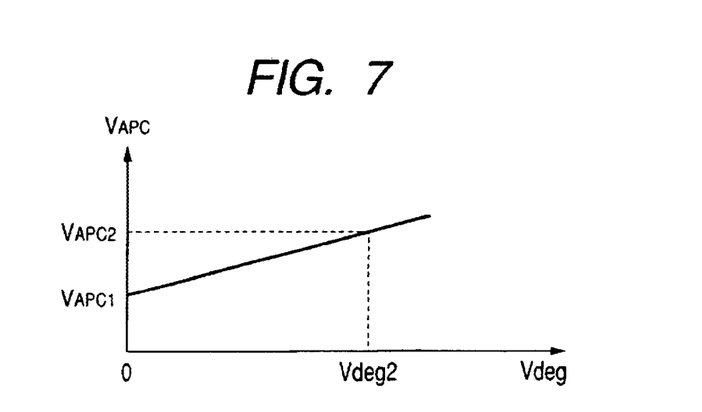
FIG. 7 illustrates the relationship between a signal Vdeg for controlling the current to be injected to the laser and a signal voltage VAPC for controlling the light intensity of the laser.
Figure 8:
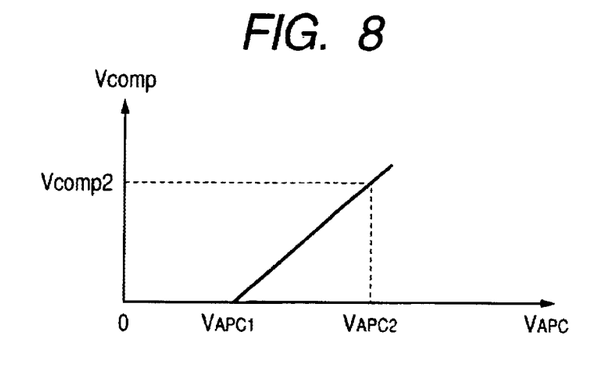
FIG. 8 illustrates the relationship between the signal voltage VAPC for controlling the light intensity of the laser and a compensation voltage Vcomp for restraining wavelength fluctuations.

As shown in FIG. 6, the variation in the wavelength of the output optical signals accompanying a change in the injected current of the semiconductor laser device 50 is monitored with the optical wavelength meter 62. The current injected into the laser is increased with a Vdeg signal to simulate a deteriorated state of the laser. VAPC at the time rises with an increase in the Vdeg signal. This state is illustrated in FIG. 7. VAPC1 varies from its initial level (Vdeg=1) to VAPC2 when a Vdeg2 signal is given. A compensation voltage Vcomp to prevent the wavelength from varying then is generated, in response to the reception of a monitor signal Vmon for the optical wavelength by the optical wavelength meter 62, after compensation by an optical wavelength compensating circuit 61 not to let Vmon be varied. The relationship between VAPC and Vcomp is stored into a memory element in the optical wavelength compensating circuit 61, and at the same time the compensation voltage Vcomp is also added to a comparator 58. This relationship between VAPC and Vcomp is illustrated in FIG. 8. By using the aforementioned memory element, for instance a PROM, it is made possible to read out, as VAPC varies from its initial state, a compensation voltage Vcomp matching the quantity of variation and thereby to keep the laser wavelength stable.

In actual degradation, the light emitting efficiency of the laser element 50 drops, and the APC circuit 56 increases the current injected into the laser. As a compensation voltage matching the variation in the injected current is then read out of the memory element, the wavelength of the laser is kept stable.

The advantages of using a PROM as the memory element include that the optical wavelength can be easily controlled, even where the relationship of the compensation voltage to the laser temperature is nonlinear, by storing the compensation voltage into the PROM and then reading it out, and that wavelength stabilization can be achieved with high accuracy, even where temperature characteristics of the optical splitter, wavelength filter and light receiving elements fluctuate, by storing compensation voltages matching the fluctuations into the PROM.

Where it is known in advance that the temperature-dependence and fluctuations in the temperature characteristics of the optical splitter, wavelength filter and light receiving elements are insignificant, wavelength stabilization can be achieved with high accuracy even without using a PROM or any such memory element by using a configuration in which a known compensation voltage is given at the time the injected current varies.

To add, while FIG. 6 shows an arrangement in which the wavelength of the backward output light is monitored, the same principle would apply to wavelength control by the same method using the forward output light of the laser, and wavelength stabilization can be achieved with high accuracy.

Embodiment 2

Figure 9:
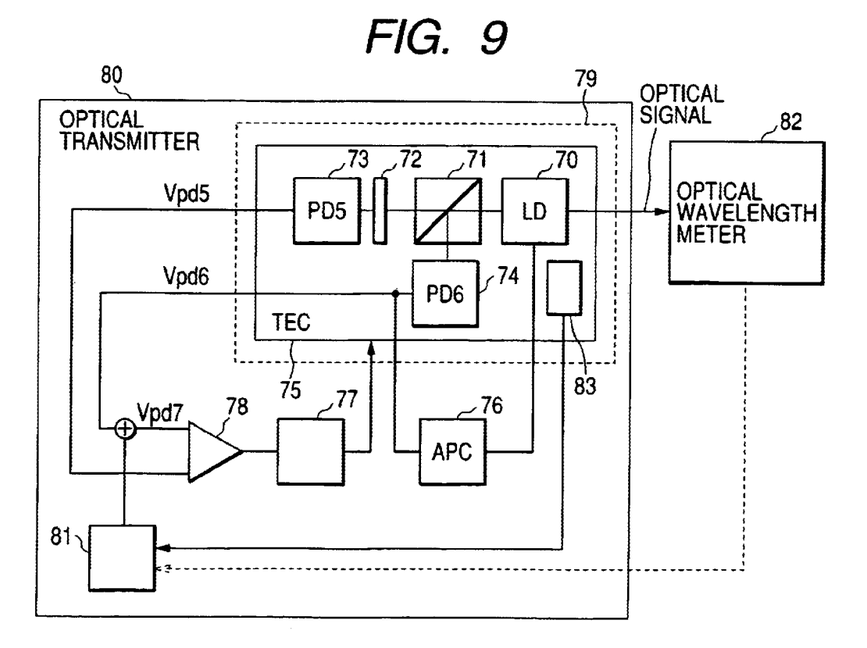
FIG. 9 illustrates another example of wavelength control method according to the invention.

FIG. 9 illustrates an embodiment of the invention in another mode. By detecting any variation in laser temperature arising from a change in injected current with a thermosensitive element such as a thermistor, and by storing a compensation voltage matching a variation in laser temperature into a PROM or the like in an optical wavelength compensation circuit 81, the oscillation wavelength can be stabilized similarly to Embodiment 1. In FIG. 9, reference numeral 83 denotes the thermistor. Other aspects of the basic configuration are the same as the irrespective counterparts in the embodiment illustrated in FIG. 6, and accordingly their detailed description is dispensed with. In this diagram, reference numeral 70 denotes a laser element; 71 denotes an optical splitter; 72 denotes a wavelength filter; 73 and 74 denote light receiving elements; 75 denote a TEC; 76 denotes an auto-power control (APC) circuit; 77 denotes a temperature control circuit; 78 denotes a comparator; 79 denotes a laser module with wavelength monitor; 80 denotes an optical transmitter; and 82 denotes an optical wavelength meter.

In this case, too, if it is known in advance that the temperature-dependence and fluctuations in the temperature characteristics of the wavelength filter and light receiving elements are insignificant, wavelength stabilization can be achieved with high accuracy even without using a PROM or any such memory element by giving a known compensation voltage at the time the laser temperature varies.

To recapitulate basic configurations to embody the present invention, the following can be said.

In the first form of configuration, it is a high accuracy optical wavelength stabilization circuit consisting of a laser module with wavelength monitor so composed that the output light of a laser is split by an optical splitter, one signal light is received by a light receiving element via an optical wavelength filter, and the other signal light is received by another light receiving element; the laser, optical splitter, optical wavelength filter and light receiving elements are mounted on the same TEC, a comparator for comparing current generated by the different light receiving elements, and a temperature control circuit for receiving the resultant comparison signal and controlling the temperature of the TEC on that basis, further provided with one or more high accuracy compensation circuits for adding to the comparator a signal to compensate for the quantity of optical wavelength variation matching any variation in the power injected into the laser.

In the second form of configuration, it is an optical transmitter provided with one or more high accuracy optical wavelength stabilization circuits each consisting of a laser module with wavelength monitor so composed that the laser output light is split by an optical splitter, one signal light is received by a light receiving element via an optical wavelength filter, and the other signal light is received by another light receiving element; the laser, optical splitter, optical wavelength filter and light receiving elements are mounted on the same TEC, a comparator for comparing current generated by the different light receiving elements, and a temperature control circuit for receiving the resultant comparison signal and controlling the temperature of the TEC on that basis, further provided with one or more high accuracy compensation circuits for adding to the comparator a signal to compensate for the quantity of optical wavelength variation matching any variation in the power injected into the laser.

In the third form of configuration, it is a high density optical wavelength multiplexing system using an optical transmitter provided with one or more high accuracy optical wavelength stabilization circuits each consisting of a laser module with wavelength monitor so composed that the laser output light is split by an optical splitter, one signal light is received by a light receiving element via an optical wavelength filter, and the other signal light is received by another light receiving element; the laser, optical splitter, optical wavelength filter and light receiving elements are mounted on the same TEC, a comparator for comparing current generated by the different light receiving elements, and a temperature control circuit for receiving the resultant comparison signal and controlling the temperature of the TEC on that basis, further provided with one or more high accuracy compensation circuits for adding to the comparator a signal to compensate for the quantity of optical wavelength variation matching any variation in the power injected into the laser.

As hitherto described, according to the present invention, an optical transmitter for use in a wavelength multiplexing system using a laser module with wavelength monitor in which a laser element, optical splitter, wavelength filter and light receiving elements are mounted on the same TEC can restrain optical wavelength fluctuations of optical signals which would otherwise occur after deterioration, and wavelength stabilization can be achieved with high accuracy. Furthermore, according to the invention, a compact high density optical wavelength system can be realized.

What is claimed is:

1. An optical transmitter comprising:

a laser module with a wavelength monitor provided with the laser module, in which a semiconductor laser, an optical splitter, a wavelength filter formed with a material of an etalon and first and second light receiving elements are mounted on one thermoelectric cooler, the output light of said semiconductor laser is split by said optical splitter into a plurality of output lights, one signal light of said output lights is received by said first light receiving element via said wavelength filter formed with the material of the etalon and another signal light of said output lights is received by said second light receiving element;

a comparator for comparing the output signals of said first and second light receiving elements so as to generate a comparison signal;

a temperature control circuit for controlling the temperature of said thermoelectric cooler on the basis of said comparison signal from said comparator; and a compensation circuit for transmitting to said comparator a predetermined signal that compensates for the quantity of any variation of optical wavelength due to a variation of injected current into said semi-conductor laser.

2. An optical transmitter comprising:

a laser module, in which a semiconductor laser, an optical splitter, a wavelength filter formed with a material of an etalon and first and second light receiving elements are mounted on one thermoelectric cooler, the output light of said semiconductor laser is split by said optical splitter into a plurality of output lights, one signal light of said output lights is received by said first light receiving element via said wavelength filter formed with a material of the etalon and another signal light of said output lights is received by said second light receiving element;

a comparator which compares the output signals of said first and second light receiving elements so as to generate a comparison signal;

a temperature control circuit which controls the temperature of said thermoelectric cooler on the basis of said comparison signal from said comparator; and a compensation circuit which transmits to said comparator a predetermined signal that compensates for the quantity of any variation of optical wavelength due to a variation of power injected into said semi-conductor laser.

3. An optical transmitter comprising:

a laser module, in which a semiconductor laser, an optical splitter, a wavelength filter formed with a material of an etalon and first and second light receiving elements and a thermistor which measures temperature of said semiconductor laser are mounted on a thermoelectric cooler, the output light of said semiconductor laser is split by said optical splitter into a plurality of output lights, one signal light of said output lights is received by said first light receiving element via said wavelength filter formed with a material of the etalon and another signal light of said output lights is received by said second light receiving element;

a thermistor which measures the temperature of said semiconductor laser;

a comparator which compares the output signals of said first and second light receiving elements so as to generate a comparison signal;

a temperature control circuit which controls the temperature of said thermoelectric cooler on the basis of said comparison signal from said comparator; and a compensation circuit which transmits to said comparator a predetermined signal that compensates for the quantity of any variation of optical wavelength due to a variation of injected current into said semi-conductor laser, wherein a compensation signal for any temperature change of the laser is provided to said comparator on the basis of the output signal of said thermistor.

4. An optical transmission system comprising:

an optical transmitter provided with a laser module, in which a semiconductor laser, an optical splitter, a wavelength filter formed with a material of an etalon and first and second light receiving elements are mounted on one thermoelectric cooler, the output light of said semiconductor laser is split by said optical splitter into a plurality of output lights, one signal light of said output lights is received by said first light receiving element via said wavelength filter formed with a material of the etalon and another signal light of said output lights is received by said second light receiving element;

a comparator for comparing the output signals of said first and second light receiving elements so as to generate a comparison signal;

a temperature control circuit for controlling the temperature of said thermoelectric cooler on the basis of said comparison signal from said comparator; and a compensation circuit for transmitting to said comparator a predetermined signal that compensates for the quantity of any variation of optical wavelength due to a variation of injected current into said semi-conductor laser.

5. An optical transmitter according to claim 2, said compensation circuit further comprising:

a memory which keeps a relationship between injected signal to the semiconductor laser and compensation signals.

6. An optical transmitter according to claim 3, said compensation circuit further comprising:

a memory which keeps a relationship between temperatures of the semiconductor laser and compensation signals.

* * * * *

UNITED STATES PATENT AND TRADEMARK OFFICE
CERTIFICATE OF CORRECTION

PATENT NO. : 6,693,932 B2
DATED : February 17, 2004
INVENTOR(S) : Akashi et al.

It is certified that error appears in the above-identified patent and that said Letters Patent is hereby corrected as shown below:

<u>Title page,</u>
Item [75], Inventors, include: -- Takayuki Nakao, Yokohama, Japan --

Signed and Sealed this

Sixth Day of April, 2004

JON W. DUDAS
*Acting Director of the United States Patent and Trademark Office*